(12) United States Patent
Prechtl et al.

(10) Patent No.: US 7,692,268 B2
(45) Date of Patent: Apr. 6, 2010

(54) INTEGRATED CIRCUIT WITH BIPOLAR TRANSISTOR

(75) Inventors: Gerhard Prechtl, St. Jakob im Rosental (AT); Marcel Kreuzberg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 263 days.

(21) Appl. No.: 11/829,278

(22) Filed: Jul. 27, 2007

(65) Prior Publication Data

US 2008/0023794 A1    Jan. 31, 2008

(30) Foreign Application Priority Data

Jul. 28, 2006   (DE) .................. 10 2006 035 121

(51) Int. Cl.
*H01L 23/58*   (2006.01)
(52) U.S. Cl. ................ 257/558; 257/565; 257/E29.02; 257/E29.026
(58) Field of Classification Search ................ 257/557, 257/558, 565, E29.02, E29.026
See application file for complete search history.

(56) References Cited

U.S. PATENT DOCUMENTS

| | | | | |
|---|---|---|---|---|
| 5,021,856 A | * | 6/1991 | Wheaton | 257/565 |
| 5,347,156 A | | 9/1994 | Sakane | |
| 5,387,553 A | * | 2/1995 | Moksvold et al. | 438/339 |
| 5,675,175 A | * | 10/1997 | Iranmanesh | 257/565 |
| 6,060,761 A | * | 5/2000 | Kawakita et al. | 257/557 |
| 6,372,595 B1 | | 4/2002 | Thiel et al. | |
| 6,677,625 B2 | * | 1/2004 | Yanagihara et al. | 257/200 |
| 6,768,183 B2 | * | 7/2004 | Takahashi et al. | 257/511 |
| 6,844,575 B2 | * | 1/2005 | Shirakawa | 257/197 |
| 6,858,887 B1 | * | 2/2005 | Li et al. | 257/197 |

* cited by examiner

*Primary Examiner*—Wael Fahmy
*Assistant Examiner*—John C Ingham
(74) *Attorney, Agent, or Firm*—Dicke, Billig & Czaja, PLLC (57) ABSTRACT

An integrated circuit including a bipolar transistor is disclosed. One embodiment provides an insulation structure used to form a junction insulation, a collector structure formed inside a semiconductor zone having openings dividing the collector structure into collector zones. The collector zones are arranged in such a manner that a shortest lateral distance between an emitter zone and the insulation structure runs at least through one of the collector zones.

19 Claims, 7 Drawing Sheets

INTEGRATED CIRCUIT WITH BIPOLAR TRANSISTOR

CROSS-REFERENCE TO RELATED APPLICATIONS

This Utility Patent Application claims priority to German Patent Application No. DE 10 2006 035 121.5 filed on Jul. 28, 2006, which is incorporated herein by reference.

BACKGROUND

The description relates to a bipolar transistor with a reduced substrate current.

Bipolar transistors are extremely important when implementing a multiplicity of circuits, for instance for amplifying signals or in reference voltage circuits. This type of transistor forms the basis of pure bipolar semiconductor technologies but is also found in mixed technologies which combine bipolar transistors with CMOS (Complementary Metal Oxide Semiconductor) or DMOS (Double Diffused Metal Oxide Semiconductor) concepts, for instance. This makes it possible to implement a multiplicity of applications in the automobile, consumer or else industrial electronics sector, for example. The development of current and future semiconductor technologies is aimed at reducing the minimum structure sizes in order to increase the integration density of semiconductor components on a semiconductor wafer and thus save costs. The dimensions of bipolar transistors are also reduced as a result.

Within the scope of this reduction in the component dimensions, the insulation regions are closer to the collectors, in particular in the case of lateral bipolar transistors. In the case of semiconductor technologies with junction insulation, that is to say electrical insulation between adjacent semiconductor components using reverse-biased pn junctions, a distance between an emitter region of the bipolar transistor and the insulation is thus also reduced. Since the emitter and the base of the bipolar transistor form, together with the semiconductor region of the adjoining insulation, a parasitic bipolar transistor, an increased gain of this parasitic transistor is to be expected as the dimensions of the bipolar transistor are reduced further. This is due to the fact that the distance between the emitter and the insulation, which defines the width of the base, decreases as the component dimensions are reduced. However, an associated increase in the substrate current, that is to say in the collector current of the parasitic bipolar transistor, is undesirable since the substrate current can lead to undesirable driving of adjacent bipolar transistors and likewise increases the power consumption of the circuit. Such undesirable driving of adjacent bipolar transistors may result in components in the semiconductor chip being destroyed.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A bipolar transistor with a reduced substrate current would be desirable.

The present invention provides an integrated circuit including a bipolar transistor. One embodiment provides a bipolar transistor having a semiconductor zone which adjoins a surface of a semiconductor body and is of a first conductivity type; an insulation structure which surrounds the semiconductor zone in the semiconductor body and is of a second conductivity type that is opposite the first conductivity type; at least one emitter zone which is formed inside the semiconductor zone and is of the second conductivity type; a collector structure which is formed inside the semiconductor zone, is of the second conductivity type, is at a lateral distance from the at least one emitter zone and partially surrounds the latter, the collector structure having openings which divide the structure into collector zones, the collector zones being arranged in such a manner that a shortest lateral distance between the at least one emitter zone and the insulation structure runs at least through one of the collector zones; and a base connection zone which is formed in the semiconductor zone and is of the first conductivity type. The collector structure may thus be subdivided into 2 . . . n collector zones, where n is an integer greater than 2.

Without crossing a collector zone, an emitter current injected into the base by the emitter does not pass along a shortest path through the base to the insulation structure. The arrangement of the collector structure is thus equivalent to effectively increasing the width of the base of the parasitic bipolar transistor whose collector is formed by the insulation structure.

The first conductivity type may be an n type, the second conductivity type being a p type in this case. The p and n types may also be assigned to the first and second conductivity types in the reverse manner. In the former case, the bipolar transistor would be in the form of a pnp transistor and the parasitic bipolar transistor has an insulation structure of the p type as collector.

The semiconductor zone may be, for example, part of an epitaxial layer which is grown on a semiconductor wafer. It is also possible for the semiconductor zone to be implanted or diffused in the semiconductor body as a well zone. In this case, epitaxial growth would not be needed to form the semiconductor zone. A semiconductor substrate which is formed under the semiconductor zone and is part of the semiconductor body is of the conductivity type of the insulation structure, for example. Si, SiGe, Ge, III-V compound semiconductors such as GaAs or else ternary or quaternary compound semiconductors are suitable, for example, as the material for the semiconductor zone and semiconductor body.

The insulation structure may be produced inside the semiconductor body by using diffusion from a solid source or ion implantation, for instance.

The insulation structure is constructed from the semiconductor body and a junction insulation region which is used for electrical insulation between adjacent semiconductor components. The semiconductor zone is thus surrounded by the insulation structure, apart from its surface with respect to a metalization and wiring region. The semiconductor zone laterally adjoins the junction insulation region and vertically adjoins the semiconductor body, for example a semiconductor wafer which is used as a substrate.

In another embodiment, the openings are formed in those regions inside the semiconductor zone which are different to other regions which define the shortest lateral distance between the emitter zone and the insulation structure.

In another embodiment, an outer edge which surrounds the collector structure at the surface is rectangular. The rectangular outer edge thus encloses the openings in the collector structure and the collector zones of the latter. An inner side of the collector structure may also be rectangular but the shape of the inner side may also assume another geometry.

The openings may also be arranged in the region of at least two opposite corners of the collector structure. If the collector structure is rectangular, for example, the openings are in the region of the diagonals.

For example, the collector structure has at least two openings which separate the collector structure in the region of an edge in such a manner that the two adjacent collector zones engage in one another in the region of the separated edge. The opening on one side is thus delimited by one of the two adjacent collector zones and adjoins the other of the two adjacent collector zones on the other side. The opening thus defines a current path, that is to say a base current path, via which minority charge carriers can pass from the emitter of the collector structure to the insulation structure which is used as the collector of the parasitic transistor.

In another embodiment, the collector structure is in the form of a hexagonal ring at the surface. In this case, according to another aspect of the invention, the collector structure has three openings which are formed with respect to each alternate edge and separate the collector structure into three collector zones in such a manner that two adjacent collector zones engage in one another in the region of the respective separated edge. One opening on one side is again delimited by one of the two associated collector zones and is delimited by the other of the two adjacent collector zones on the opposite side. The opening runs, for example, at least partially parallel or virtually parallel to the adjacent outer edge of the hexagonal ring.

The collector structure may be in the form of a circular ring at the surface. For example, the collector structure has at least two openings which separate the latter in such a manner that the collector zones which are adjacent as a result respectively engage in one another in the azimuthal direction. The respective opening likewise preferably runs at least partially in the azimuthal or virtually azimuthal direction, each opening on one side being delimited by one of the two adjacent collector zones and being delimited by the other of the two adjacent collector zones on the other side.

In another embodiment, the collector structure is in the form of a polygon at the surface and has at least two openings which are respectively in the region of an edge, with the result that the collector zones which are adjacent as a result respectively engage in one another in the region of the separated edge. The opening again runs at least partially parallel or virtually parallel to the separated edge, thus achieving a pronounced lengthening of the effective width of the base of the parasitic bipolar transistor.

For example, provision may be made of a buried layer which is of the first conductivity type and has a dopant concentration that is at least two orders of magnitude higher than that of the semiconductor zone, the buried layer being embedded inside the semiconductor zone and/or being arranged between the semiconductor zone and the semiconductor body. The buried layer is used, for example, to reduce the gain of that vertical parasitic bipolar transistor whose collector is formed from the underlying semiconductor body or semiconductor substrate. On account of the comparatively high dopant concentration inside the buried layer which acts as the base of the parasitic bipolar transistor, increased recombination inside the base can be achieved and the gain of the vertical parasitic bipolar transistor can thus be reduced.

For example, a lateral thickness of the collector structure which is arranged around the emitter zone fluctuates, and collector connection zones are placed in those regions of the collector structure which have a comparatively greater thickness. The collector connection zones may be electrically connected to a metalization and wiring region, which is formed above the semiconductor body, using contact plugs, for example.

Figure 1:
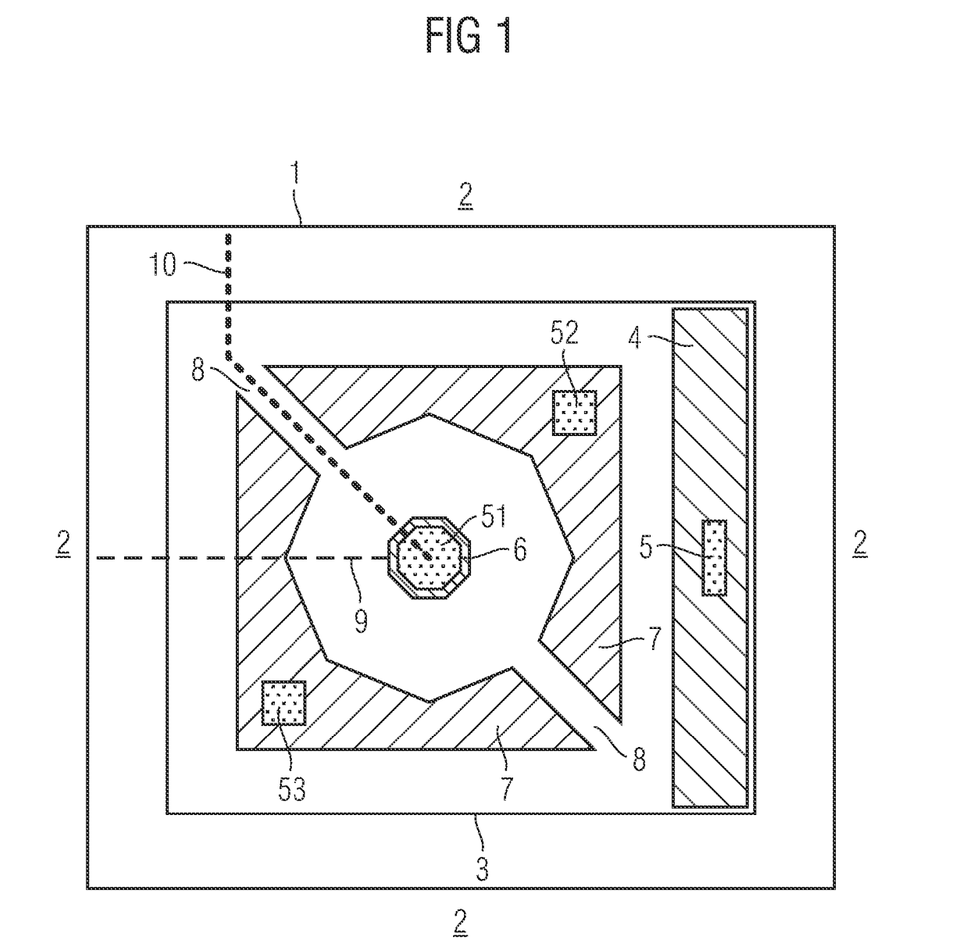
FIGS. 1 to 6 illustrate schematic plan views of example embodiments of an integrated circuit including a transistor.

FIG. 1 illustrates a schematic plan view of an integrated circuit including a lateral bipolar transistor according to a first embodiment, the structures illustrated in plan view being outlined in a simplified illustration. A semiconductor zone 1 of the n type is used as the base zone of the bipolar transistor. The semiconductor zone 1 is surrounded by an insulation structure 2 of the p type. The semiconductor zone 1 and the insulation structure 2 form a pn junction. The insulation structure 2 is thus used for electrical insulation between adjacent semiconductor components in the form of a junction insulation using reverse-biased pn junctions. The lateral pnp transistor also has a buried insulation structure 3 which is of the n type and is positioned between the semiconductor zone 1 and a semiconductor substrate that is arranged under the semiconductor zone 1 (cannot be seen in the plan view). The buried layer 3 is used to reduce the gain of that parasitic vertical bipolar transistor whose collector is formed by the semiconductor substrate which is arranged under the semiconductor zone 1 and is of the p conductivity type. If the semiconductor zone 1 is grown epitaxially, for instance, the buried layer 3 can be implanted before epitaxy and can be diffused out using a subsequent temperature budget of the process. It may also be advantageous to produce the buried layer 3 using high-energy implantation.

The semiconductor zone 1 which is used as the base is conductively connected to a contact plug 5 via a base connection zone 4 which is of the n conductivity type and has a dopant concentration that is higher than that of the semiconductor zone 1. The contact plug 5 may be metallic, for example, and may connect the base zone to a metalization and wiring region (not illustrated). It goes without saying that there may be a plurality of contact plugs 5. In addition, the bipolar transistor has an emitter zone 6 which is of the n conductivity type and is likewise connected to the metalization and wiring region using a contact plug 51. Provided around the emitter zone 6 is a collector structure 7 which is formed inside the semiconductor zone 1, the outer edge of which is square and which has a respective opening 8 in the region of two opposite corners. The collector structure 7 has contact plugs 52, 53 in the corners which are not provided with openings 8, the contact plugs ensuring the connection to the metalization and wiring region.

A shortest path 9 from the emitter zone 6 to the insulation structure 2 defines the shortest distance between the emitter and collector of the parasitic lateral pnp bipolar transistor with the insulation structure 2 which acts as collector. However, charge carriers which are injected along this path by the emitter 6 are dissipated by the collector 7 and do not contribute to the substrate current, that is to say the collector current of the parasitic pnp bipolar transistor. A current path in the parasitic pnp bipolar transistor between the emitter zone 6 and insulation structure 2 is provided with the reference symbol 10. This current path 10 first of all runs along a diagonal of the collector structure 7 and, outside the collector structure 7, on the shortest path to the insulation structure 2. If the paths 9 and 10 are compared, it is determined that the openings in the collector structure 7 are placed in such a manner that the current path from the emitter 6 to the insulation structure 2, that is to say from the emitter to the collector of the parasitic bipolar transistor, is lengthened. This is equivalent to increasing the effective width of the base of this parasitic bipolar transistor and thus reducing its gain or reducing the substrate current.

Figure 2:
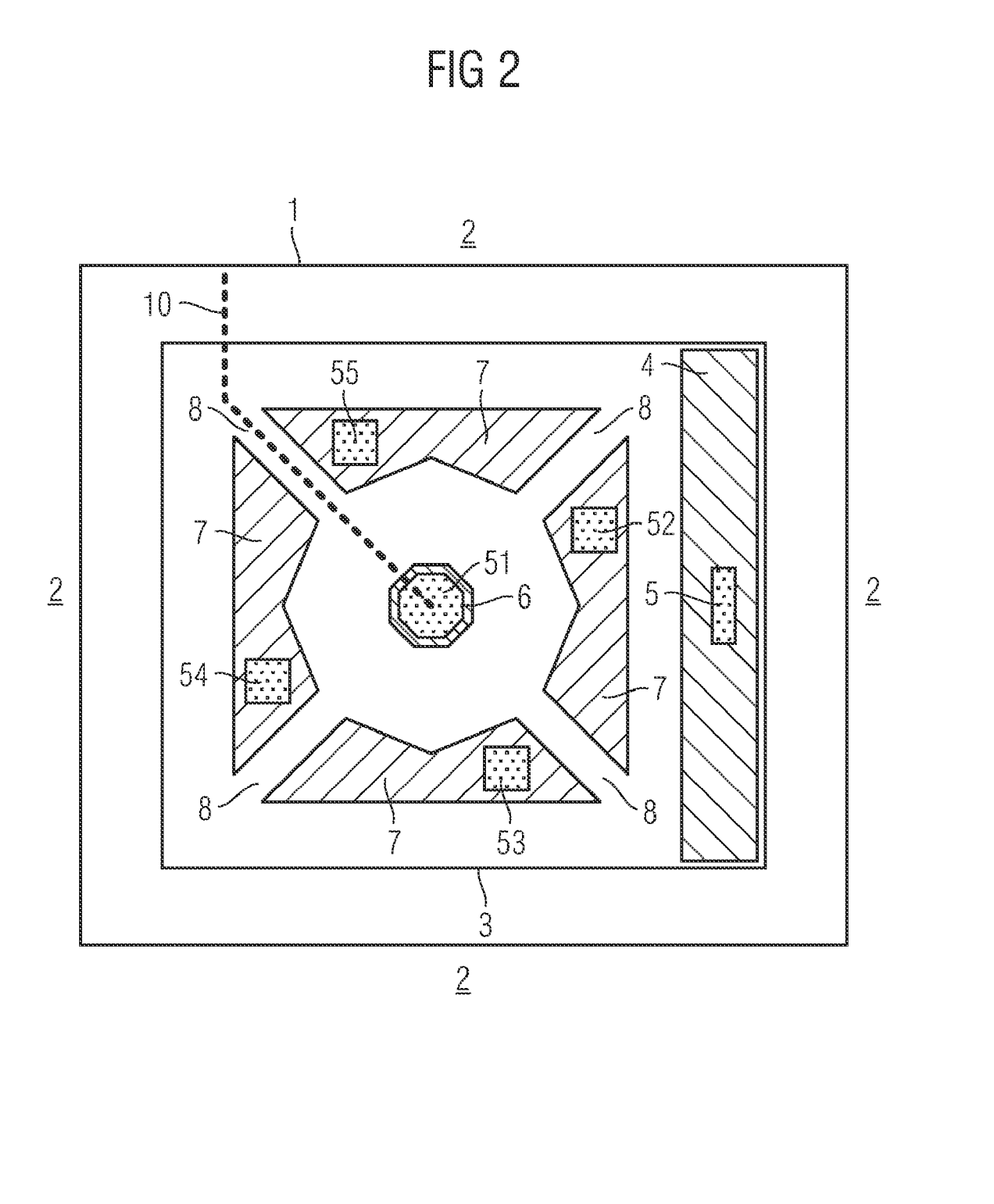

FIG. 2 is a schematic plan view of a bipolar transistor according to another embodiment. In this embodiment and in the other embodiments, elements which correspond to those in the embodiment illustrated in FIG. 1 are labeled with the same reference symbols and are not described again. In contrast to the embodiment of FIG. 1, the embodiment illustrated in FIG. 2 has four, rather than two, openings 8 inside the collector structure 7, all of the openings being formed in the corner regions of the outwardly square collector structure 7.

Figure 3A:
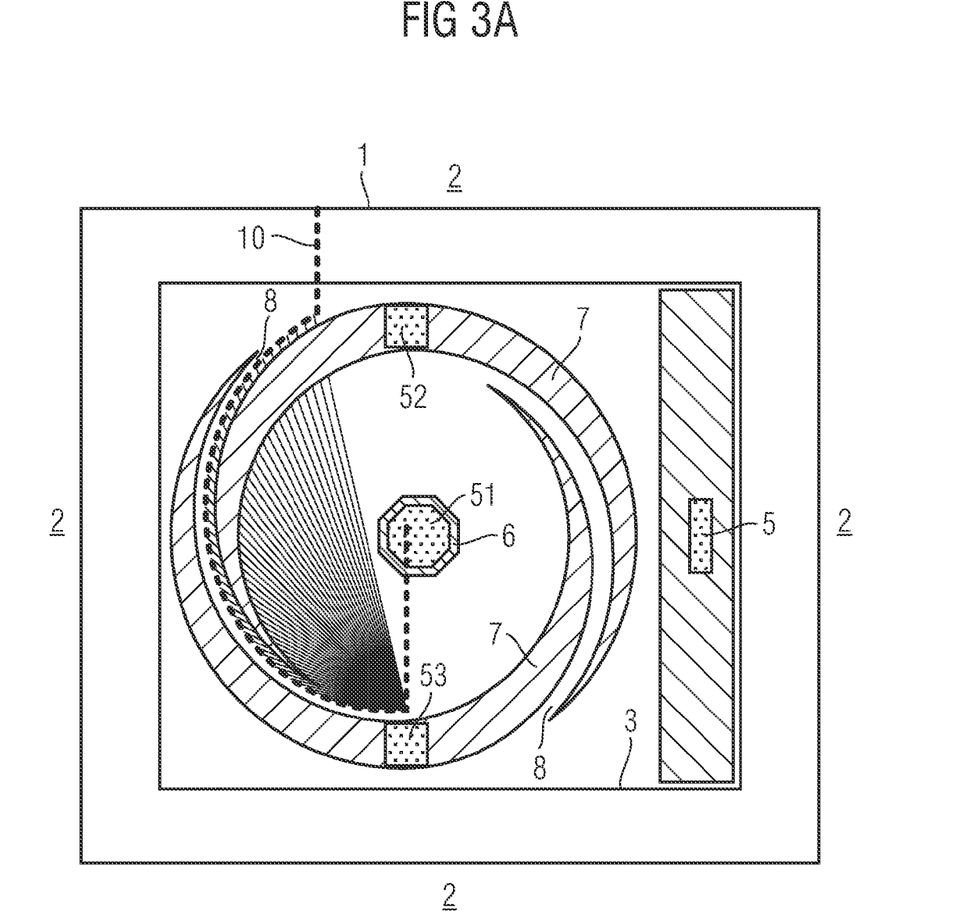

FIG. 3a illustrates a schematic plan view of a bipolar transistor according to another embodiment of the invention. In contrast to the embodiments illustrated in FIGS. 1 and 2, the collector structure 7 is both outwardly and inwardly circular in this case. In accordance with the embodiment of FIG. 1, the collector structure has two openings 8 which, however, run in an approximately azimuthal direction, that is to say along a circular line, with respect to the emitter zone 6. The openings 8 thus run approximately parallel to the outer and inner edges of the collector structure and subdivide the latter into two collector zones which engage in one another. In comparison with the embodiments illustrated in FIGS. 1 and 2, this achieves an even more pronounced lengthening of the effective width of the base (see current path 10) of the parasitic bipolar transistor. Consequently, the substrate current, that is to say the collector current of the parasitic bipolar transistor, is reduced further in this embodiment.

Figure 3B:
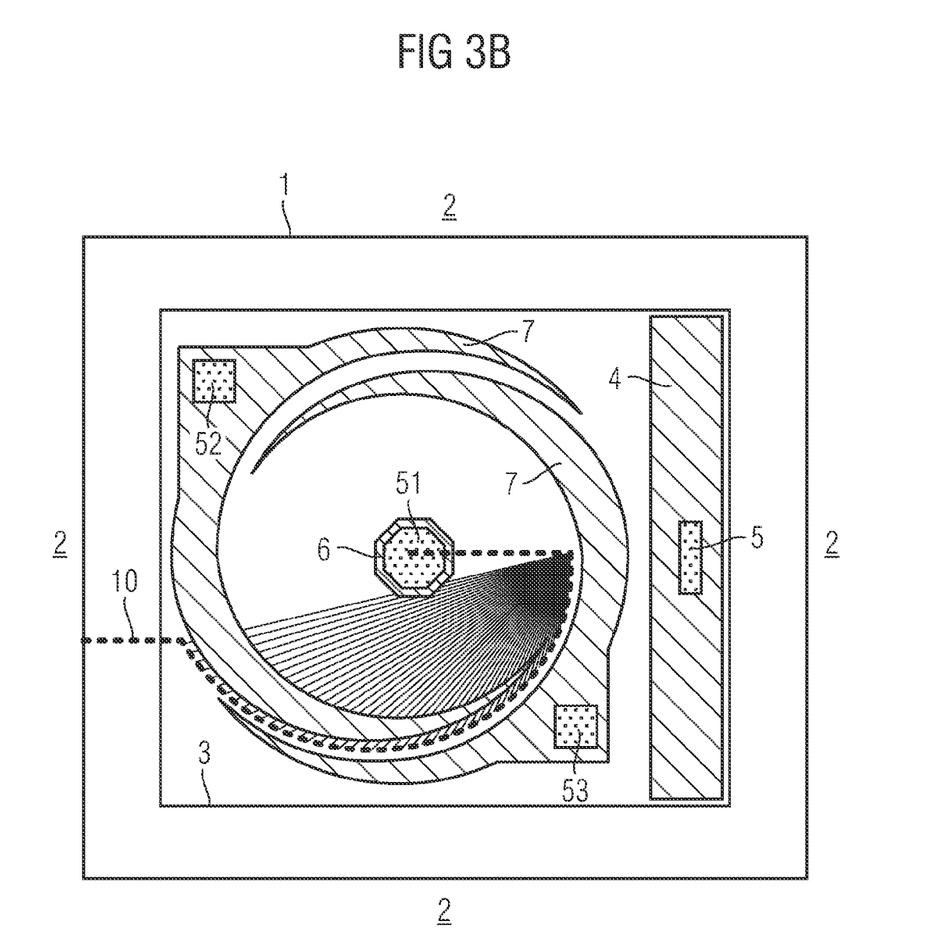

The plan view of a bipolar transistor according to another embodiment, which is illustrated in FIG. 3b, differs from the embodiment illustrated in FIG. 3a by virtue of the fact that the contact plugs 52 and 53 are placed differently. In this case, the collector structure 7 is formed such that it is thickened in the region of the diagonals of the semiconductor zone 1 in order to place the contact plugs 52, 53. This region which is otherwise not used in the given component geometry is thus deliberately used for contact-connection. This results in the advantage that the collector structure 7 can be designed to be thinner in other regions which concomitantly determine the component dimensions, in particular to be thinner than a minimum thickness required for contact-connection to a contact plug. The component dimensions can be reduced by placing the contacts according to this embodiment.

Figure 4:
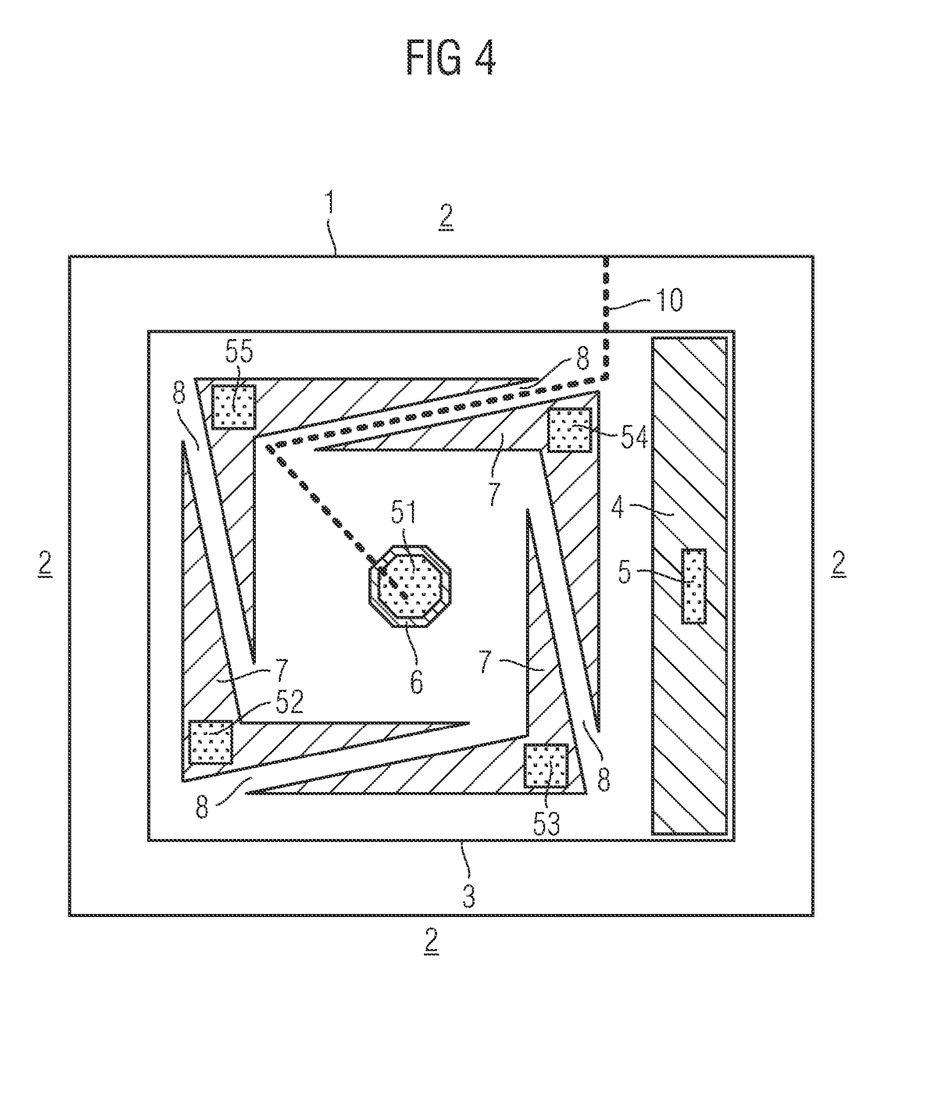

FIG. 4 illustrates a schematic plan view of a bipolar transistor according to another embodiment. The embodiment illustrated in FIG. 4 differs from the embodiment illustrated in FIG. 1 in terms of the following aspects. Although the collector structure 7 is still outwardly square, it is also square toward the inner side. In addition, the embodiment of FIG. 4 has four openings 8 inside the collector structure 7 which open the collector structure 7 with respect to each edge. The openings 8 are shaped in such a manner that the two collector zones of each edge, which are adjacent as a result of the openings 8, engage in one another. In this case, the openings 8 run from an end of an edge of the inner side to an opposite end of an edge of the outer side. As already discussed in connection with FIGS. 3a and 3b, the embodiment illustrated in FIG. 4 also has an effective width of the base of the parasitic bipolar transistor which is longer than in the embodiments of FIGS. 1 and 2.

Figure 5:
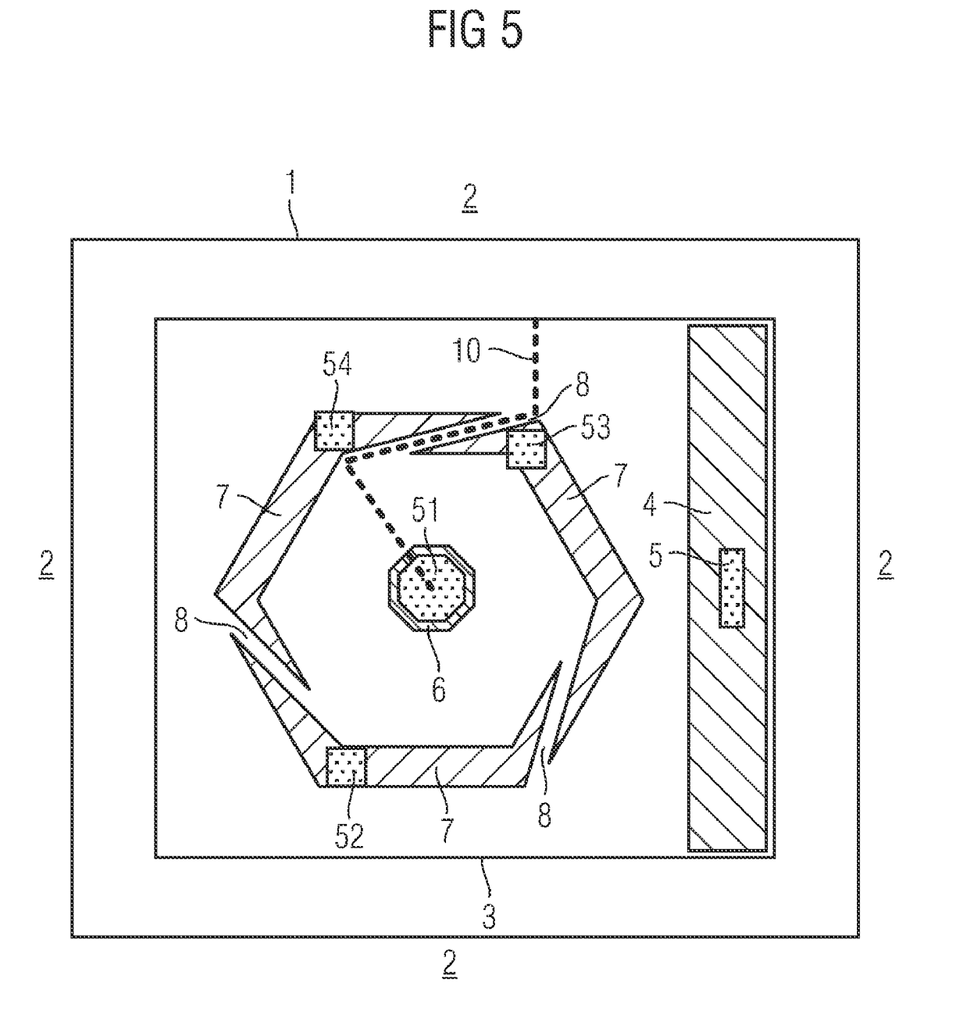

FIG. 5 illustrates a schematic plan view of a bipolar transistor according to another embodiment. In this case, the collector structure 7 is in the form of a hexagonal ring at the surface. Furthermore, provision is made of three openings 8 which are formed with respect to each alternate edge and separate the collector structure 7 into three collector zones in such a manner that two adjacent collector zones engage in one another in the region of the separated edges. The manner in which the openings 8 run along an edge is the same as that in the embodiment illustrated in FIG. 4. An effective width of the base of the parasitic bipolar transistor which is longer than in the embodiments illustrated in FIGS. 1 and 2 can again be achieved, which is equivalent to reducing the substrate current and gain.

In general, the collector structure 7 may be in the form of a polygon with separated edges. It goes without saying that the edge terminations of the collector zones, which are separated as a result of the openings 8, may be adapted within the scope of design rules on which the respective semiconductor technology is based. For example, the layout of the ends of the edges which are illustrated in FIGS. 4 and 5 and taper at an acute angle in the simplified illustration may thus be designed using right angles or obtuse angles.

Figure 6:
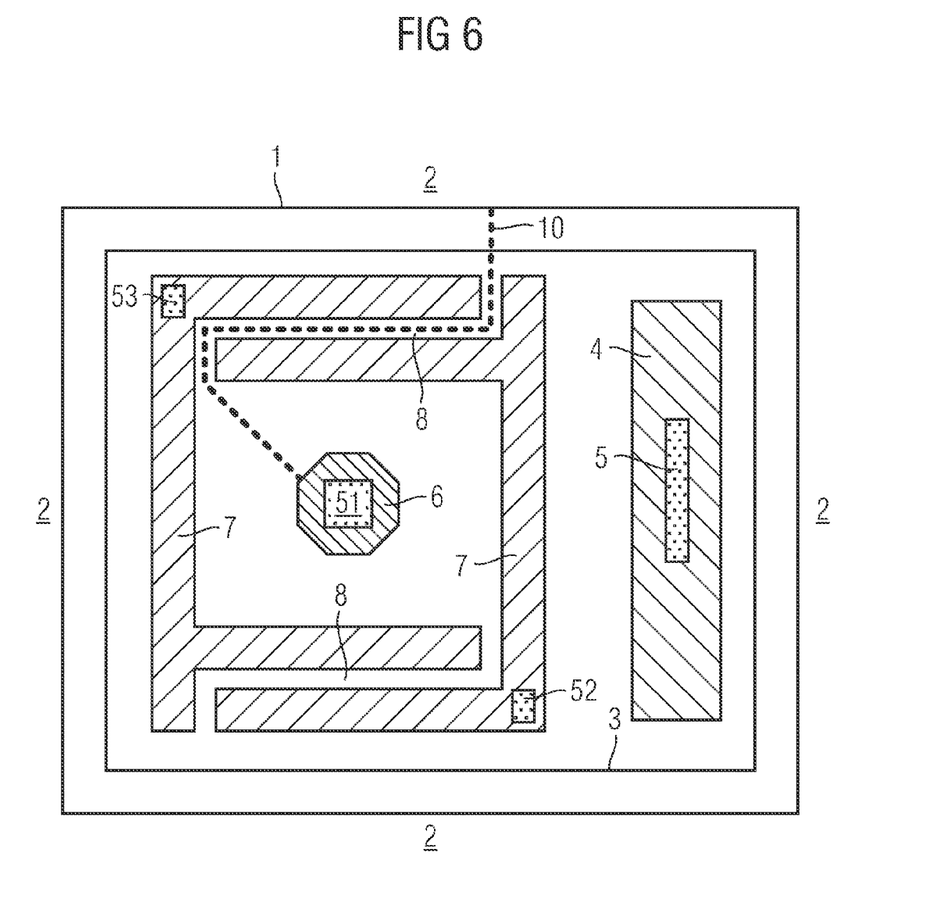

FIG. 6 illustrates a schematic plan view of a bipolar transistor according to another embodiment. In contrast to the embodiment illustrated in FIG. 4, this bipolar transistor has only two openings 8 inside the collector structure 7. The layout of the collector structure 7 is such that the collector structure 7 has only right angles and the openings 8 run parallel to edges of the collector structure 7. On account of the particular configurations of the openings 8 in the collector structure 7, the effective width of the base, that is to say the current path 10, of the parasitic bipolar transistor is again increased, with the result that the gain of this parasitic bipolar transistor and thus the substrate current can be reduced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. An integrated circuit comprising:
a bipolar transistor comprising:

an insulation structure configured to form a junction insulation:

a collector structure formed inside a semiconductor zone having openings dividing the collector structure into collector zones, the collector zones are configured such that a shortest lateral distance between an emitter zone and the insulation structure runs at least through one of the collector zones, wherein openings are arranged in a region of at least two opposite corners of the collector structure.

2. The integrated circuit of claim 1 comprising:
wherein an outer edge which surrounds the collector structure at a surface is rectangular.

3. The integrated circuit of claim 1, comprising wherein the collector structure has at least two openings which respectively separate the collector structure in the region of an edge in such a manner that the two adjacent collector zones engage in one another in the region of the separated edge.

4. An integrated circuit having a bipolar transistor comprising:
a semiconductor zone adjoining a surface of a semiconductor body, of a first conductivity type;
an insulation structure surrounding the semiconductor zone in the semiconductor body and of a second conductivity type;
at least one emitter zone formed inside the semiconductor zone, of the second conductivity type;
a collector structure formed inside the semiconductor zone, of the second conductivity type, at a distance from the at least one emitter zone, the collector structure having openings which divide the structure into collector zones, the collector zones being arranged in such a manner that a shortest lateral distance between the at least one emitter zone and the insulation structure runs at least through one of the collector zones; and
a base connection zone formed in the semiconductor zone, of the first conductivity type, wherein:
an outer edge which surrounds the collector structure at the surface is rectangular, and
the openings are arranged in the region of at least two opposite corners of the collector structure.

5. The integrated circuit of claim 4, comprising wherein the openings are formed in those regions inside the semiconductor zone which are different to other regions which define the shortest lateral distance between the emitter zone and the insulation structure.

6. The integrated circuit of claim 4, comprising wherein the insulation structure is constructed from the semiconductor body and a junction insulation region which is used for electrical insulation between adjacent semiconductor components.

7. The integrated circuit of claim 4, comprising wherein the collector structure has at least two openings which respectively separate the collector structure in the region of an edge in such a manner that the two adjacent collector zones engage in one another in the region of the separated edge.

8. An integrated circuit having a bipolar transistor comprising:
a semiconductor zone adjoining a surface of a semiconductor body, of a first conductivity type;
an insulation structure surrounding the semiconductor zone in the semiconductor body and of a second conductivity type;
at least one emitter zone formed inside the semiconductor zone, of the second conductivity type;
a collector structure formed inside the semiconductor zone, of the second conductivity type, at a distance from the at least one emitter zone, the collector structure having openings which divide the structure into collector zones, the collector zones being arranged in such a manner that a shortest lateral distance between the at least one emitter zone and the insulation structure runs at least through one of the collector zones;
a base connection zone formed in the semiconductor zone, of the first conductivity type; wherein:
the collector structure is in the form of a hexagonal ring at the surface, and
the collector structure has three openings formed with respect to each alternate edge and separate the collector structure into three collector zones in such a manner that two adjacent collector zones engage in one another in the region of the respective separated edge.

9. The integrated circuit of claim 8, wherein the collector structure has at least two openings separating the collector structure in such a manner that the collector zones which are adjacent as a result engage in one another in the azimuthal direction.

10. A bipolar transistor comprising:
a semiconductor zone adjoining a surface of a semiconductor body and is of a first conductivity type;
an insulation structure surrounding the semiconductor zone in the semiconductor body and of a second conductivity type that is opposite the first conductivity type;
at least one emitter zone formed inside the semiconductor zone and is of the second conductivity type;
a collector structure formed inside the semiconductor zone, of the second conductivity type, at a lateral distance from the at least one emitter zone and partially surrounds the latter, the collector structure having openings which divide the structure into collector zones, the collector zones being arranged in such a manner that a shortest lateral distance between the at least one emitter zone and the insulation structure runs at least through one of the collector zones; and
a base connection zone formed in the semiconductor zone and is of the first conductivity type, wherein
the openings are arranged in the region of at least two opposite corners of the collector structure.

11. The bipolar transistor of claim 10, wherein the openings are formed in those regions inside the semiconductor zone which are different to other regions which define the shortest lateral distance between the emitter zone and the insulation structure.

12. The bipolar transistor of claim 10, wherein the insulation structure is constructed from the semiconductor body and a junction insulation region which is used for electrical insulation between adjacent semiconductor components.

13. The bipolar transistor of claim 10, wherein an outer edge which surrounds the collector structure at the surface is rectangular.

14. The bipolar transistor of claim 13, wherein the collector structure has at least two openings which respectively separate the collector structure in the region of an edge in such a manner that the two adjacent collector zones engage in one another in the region of the separated edge.

15. The bipolar transistor of claim 10, wherein the collector structure is in the form of a polygon at the surface and has at least two openings which are respectively in the region of an edge, with the result that the collector zones which are adjacent as a result engage in one another in the region of the separated edge.

16. The bipolar transistor of claim 10, comprising:
a buried layer of the first conductivity type; and a dopant concentration that is at least two orders of magnitude higher than that of the semiconductor zone, the buried layer being embedded inside the semiconductor zone and/or being arranged between the semiconductor zone and the semiconductor body.

17. The bipolar transistor of claim 16, wherein a lateral thickness of the collector structure arranged around the at least one emitter zone fluctuates, and collector connection zones are placed in those regions of the collector structure which have a comparatively greater thickness.

18. A bipolar transistor comprising:
- a semiconductor zone adjoining a surface of a semiconductor body and is of a first conductivity type;
- an insulation structure surrounding the semiconductor zone in the semiconductor body and of a second conductivity type that is opposite the first conductivity type;
- at least one emitter zone formed inside the semiconductor zone and is of the second conductivity type;
- a collector structure formed inside the semiconductor zone, of the second conductivity type, at a lateral distance from the at least one emitter zone and partially surrounds the latter, the collector structure having openings which divide the structure into collector zones, the collector zones being arranged in such a manner that a shortest lateral distance between the at least one emitter zone and the insulation structure runs at least through one of the collector zones; and
- a base connection zone formed in the semiconductor zone and is of the first conductivity type, wherein:
- the collector structure is in the form of a hexagonal ring at the surface, and
- the collector structure has three openings formed with respect to each alternate edge and separate the collector structure into three collector zones in such a manner that two adjacent collector zones engage in one another in the region of the respective separated edge.

19. The bipolar transistor of claim 18, wherein the collector structure has at least two openings separating the collector structure in such a manner that the collector zones which are adjacent as a result engage in one another in the azimuthal direction.

* * * * *